United States Patent
Allman et al.

(12) 
(10) Patent No.: US 6,541,383 B1
(45) Date of Patent: Apr. 1, 2003

(54) APPARATUS AND METHOD FOR PLANARIZING THE SURFACE OF A SEMICONDUCTOR WAFER

(75) Inventors: Derryl D. J. Allman, Camas, WA (US); John W. Gregory, Battle Ground, WA (US)

(73) Assignee: LSI Logic Corporation, Milpitas, CA (US)

( * ) Notice: Subject to any disclaimer, the term of this patent is extended or adjusted under 35 U.S.C. 154(b) by 42 days.

(21) Appl. No.: 09/607,169

(22) Filed: Jun. 29, 2000

(51) Int. Cl.⁷ ............................................. H01L 21/302
(52) U.S. Cl. ..................... 438/692; 438/693; 216/88; 216/89; 451/444; 451/539; 451/57; 451/60; 451/66; 156/345.12
(58) Field of Search ................... 451/444, 539, 451/57, 60, 66; 438/692, 693; 216/88, 89; 156/345.12

(56) References Cited

U.S. PATENT DOCUMENTS

| | | | |
|---|---|---|---|
| 4,773,920 A | * | 9/1988 | Chaseman et al. ............ 51/295 |
| 5,245,790 A | | 9/1993 | Jerbic |
| 5,250,085 A | * | 10/1993 | Mevissen ..................... 51/298 |
| 5,265,378 A | | 11/1993 | Rostoker |
| 5,290,396 A | | 3/1994 | Schoenborn et al. |
| 5,298,110 A | | 3/1994 | Schoenborn et al. |
| 5,310,455 A | | 5/1994 | Pasch et al. |
| 5,321,304 A | | 6/1994 | Rostoker |
| 5,368,619 A | * | 11/1994 | Culler ......................... 51/308 |
| 5,389,194 A | | 2/1995 | Rostoker et al. |
| 5,403,228 A | | 4/1995 | Pasch |
| 5,441,094 A | | 8/1995 | Pasch |
| 5,471,091 A | | 11/1995 | Pasch et al. |
| 5,516,400 A | | 5/1996 | Pasch et al. |
| 5,532,516 A | | 7/1996 | Pasch et al. |
| 5,624,304 A | | 4/1997 | Pasch et al. |
| 5,626,715 A | | 5/1997 | Rostoker |
| 5,667,433 A | | 9/1997 | Mallon |
| 5,674,774 A | | 10/1997 | Pasch et al. |
| 5,861,055 A | | 1/1999 | Allman et al. |
| 5,865,666 A | | 2/1999 | Nagahara |

(List continued on next page.)

*Primary Examiner*—George Goudreau
(74) *Attorney, Agent, or Firm*—Maginot, Moore & Bowman, LLP

(57) ABSTRACT

An arrangement for planarizing a surface of a semiconductor wafer. The arrangement includes a planarizing member having a planarizing surface configured to be (i) positioned in contact with and (ii) moved relative to the surface of the semiconductor wafer so as to remove material from the surface of the semiconductor wafer such that the surface of the semiconductor wafer is planarized. The arrangement also includes an adherence promoting ligand chemically bonded to the planarizing surface of the planarizing member. The arrangement further includes an abrasion particle chemically bonded to the adherence promoting ligand such that the abrasion particle is attached to the planarizing surface of the planarizing member. The arrangement also includes a conditioning bar having a conditioning portion positioned in contact with a wafer track defined on the planarizing member. The conditioning portion is configured so that the conditioning portion extends completely across the wafer track. The arrangement still further includes a wafer carrier which (i) urges the surface of the semiconductor wafer against the planarizing surface at a first pressure for a first period of time and (ii) urges the surface of the semiconductor wafer against the planarizing surface at a second pressure for a second period of time. The first pressure is greater than the second pressure such that slurry is advanced from an outer periphery of the semiconductor wafer toward a center portion of the semiconductor wafer. An associated method of planarizing a surface of a semiconductor wafer is also disclosed.

15 Claims, 3 Drawing Sheets

U.S. PATENT DOCUMENTS

| | | |
|---|---|---|
| 5,868,608 A | 2/1999 | Allman et al. |
| 5,882,251 A | 3/1999 | Berman et al. |
| 5,888,120 A | 3/1999 | Doran |
| 5,893,756 A | 4/1999 | Berman et al. |
| 5,931,719 A | 8/1999 | Nagahara et al. |
| 5,948,697 A | 9/1999 | Hata |
| 5,957,757 A | 9/1999 | Berman |
| 6,060,370 A | 5/2000 | Hsia et al. |
| 6,066,266 A | 5/2000 | Osugi et al. |
| 6,077,783 A | 6/2000 | Allman et al. |
| 6,114,215 A | 9/2000 | Osugi et al. |
| 6,115,233 A | 9/2000 | Seliskar et al. |
| 6,247,998 B1 | 6/2001 | Wiswesser et al. |
| 6,284,586 B1 | 9/2001 | Seliskar et al. |

* cited by examiner

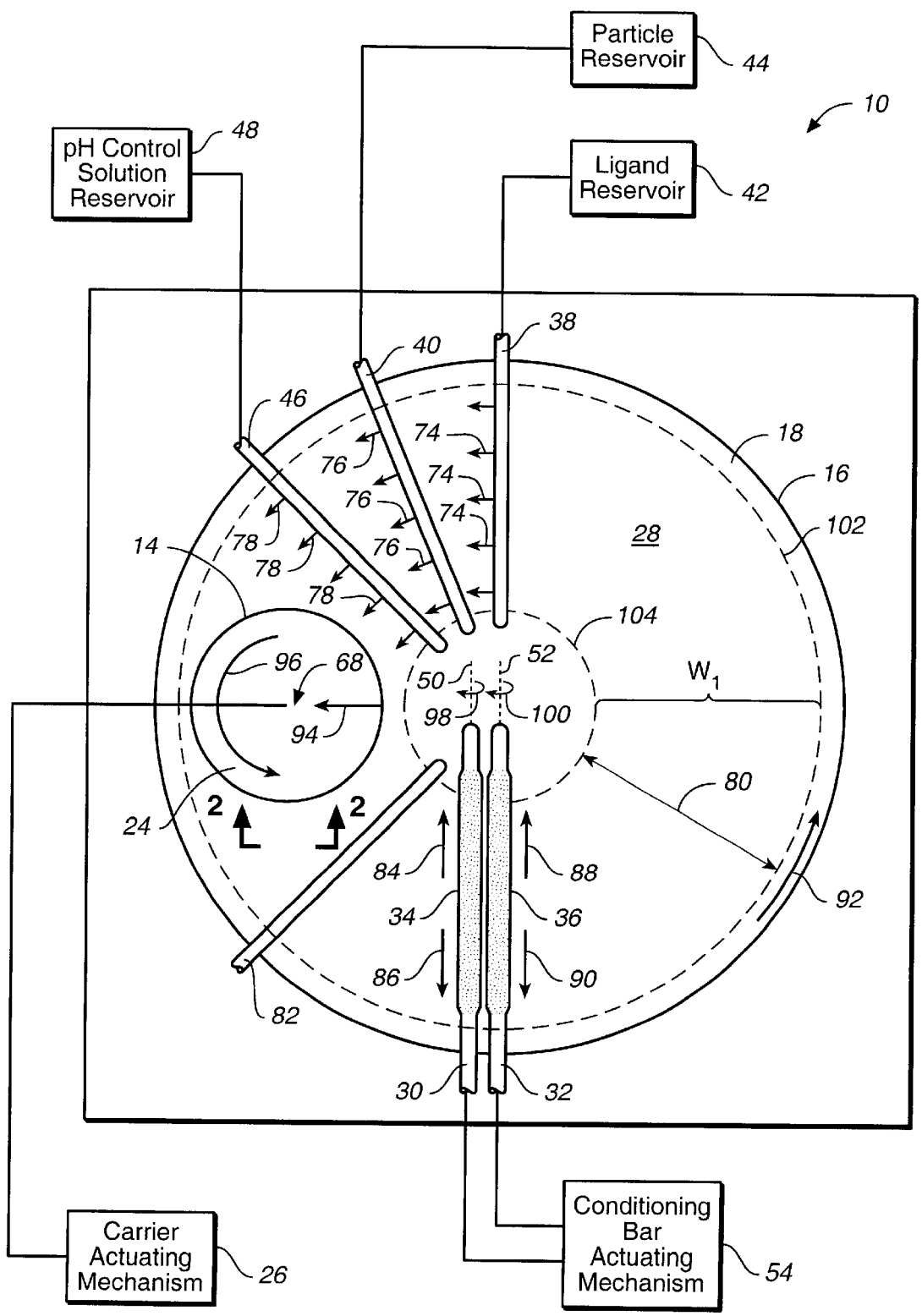
FIG._1

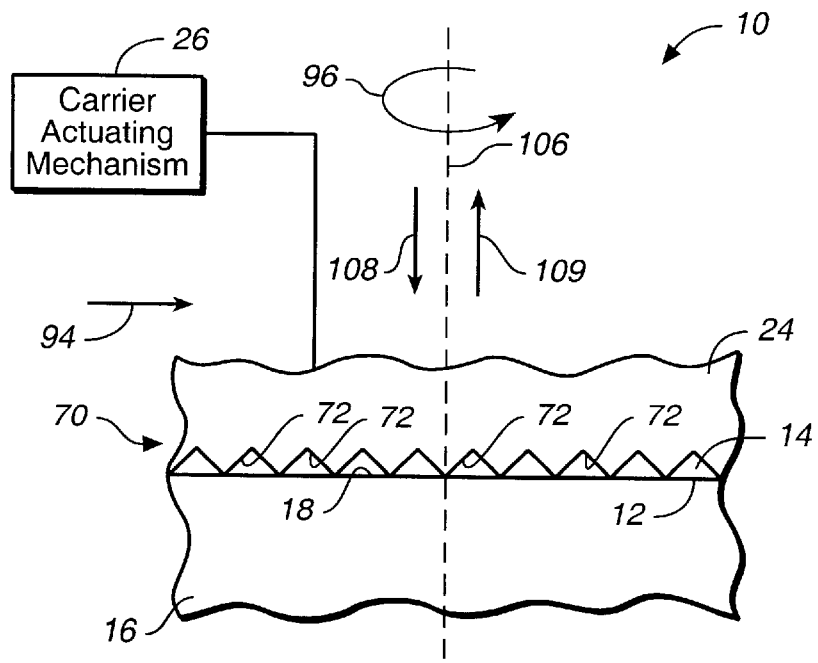
FIG._2
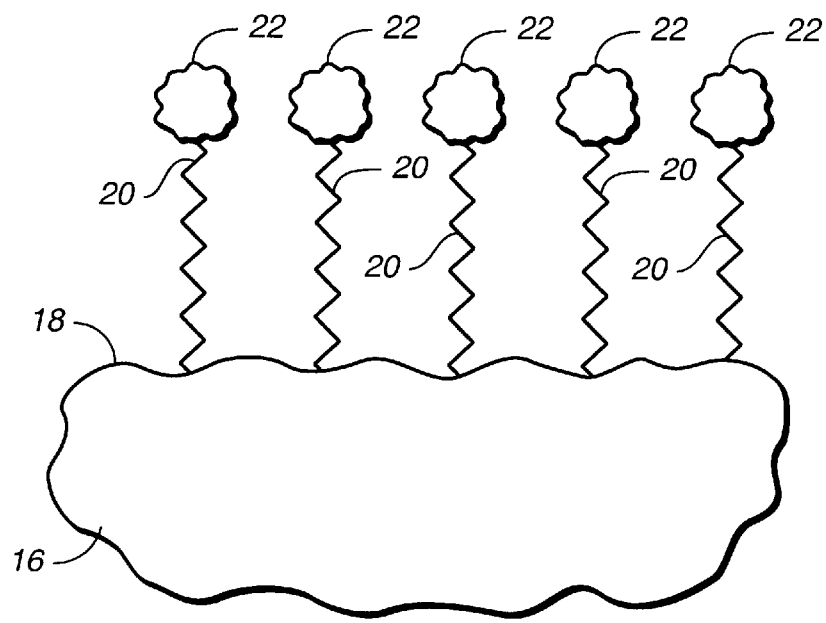
FIG._4

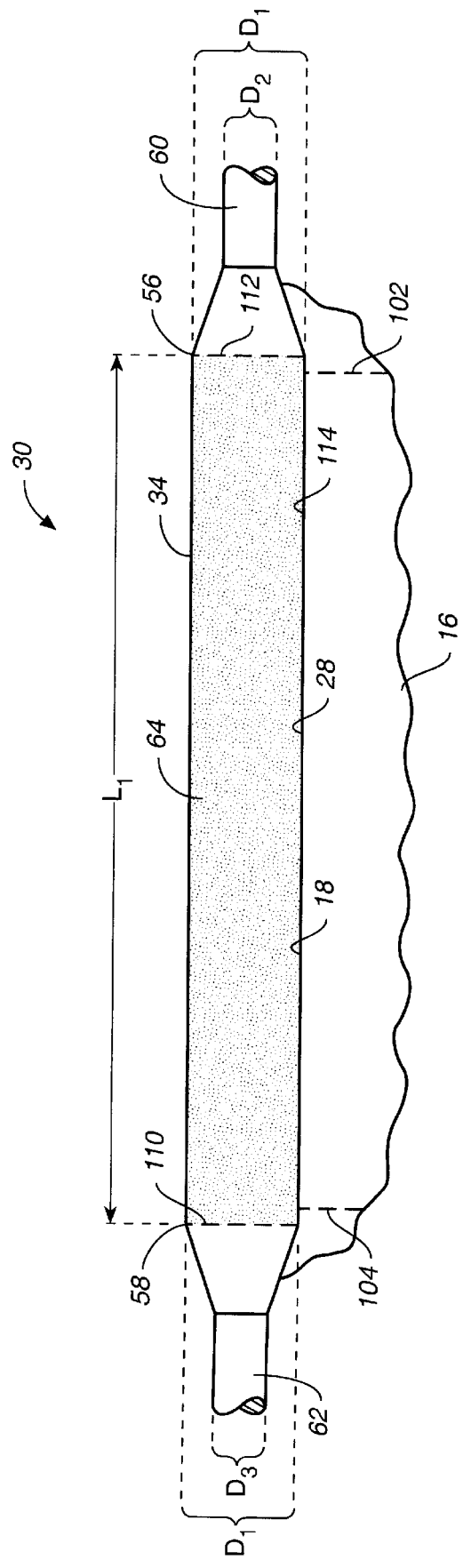
FIG._3

APPARATUS AND METHOD FOR PLANARIZING THE SURFACE OF A SEMICONDUCTOR WAFER

TECHNICAL FIELD OF THE INVENTION

The present invention relates generally to an apparatus and method for planarizing a surface of a semiconductor wafer. The present invention particularly relates to an apparatus and method for the chemical-mechanical planarization of a surface of a semiconductor wafer.

BACKGROUND OF THE INVENTION

Fabrication of a multi-level integrated circuit involves numerous processing steps. For example, after impurity regions have been deposited within a semiconductor substrate and gate areas defined upon the substrate, interconnect routing is placed on the semiconductor topography and connected to contact areas thereon. An interlevel dielectric is then formed upon and between the interconnect routing, and more contact areas are formed through the dielectric to the interconnect routing. A second level of interconnect routing may then be placed upon the interlevel dielectric and coupled to the first level of interconnect routing via the contact areas arranged within the dielectric. Additional levels of interconnect routing and interlevel dielectric may be formed if desired.

Unfortunately, unwanted surface irregularities may form in the topological surface of one or more layers employed by an integrated circuit. The formation of such irregularities can lead to various problems during integrated circuit fabrication. The concept of utilizing chemical and mechanical abrasion to planarize and remove surface irregularities of a topological surface is well known in the industry as chemical-mechanical polishing ("CMP"). A typical CMP process involves urging a semiconductor wafer face-down on a wafer track of a polishing pad which is fixedly attached to a rotatable table or platen. Elevationally extending portions of the downward-directed wafer surface are positioned such that they contact the rotating pad. A fluid-based chemical, often referred to as a "slurry" having abrasion particles disposed therein is deposited upon the pad such that the slurry becomes disposed at the interface between the pad and the wafer surface. The slurry initiates the polishing process by chemically reacting with the surface material being polished. The polishing process is facilitated by the rotational movement of the pad relative to the wafer (or vice versa) to remove material catalyzed by the slurry so as to planarize the surface of the wafer surface.

However, the above described arrangement for planarizing the wafer surface suffers from several drawbacks. For example, one drawback of the above described arrangement is that the fluid dynamics of the slurry is relied upon to advance the abrasion particles underneath the semiconductor wafer. This is a problem because urging the semiconductor wafer against the polishing pad makes it difficult for the abrasion particles contained within the slurry to be transported from the periphery of the wafer to the center of the wafer. Therefore, a higher concentration of abrasion particles are present at the periphery of the semiconductor wafer as compared to the center. This concentration gradient results in a different planarization rate for the semiconductor periphery relative to the center. Having different planarization rates on the same semiconductor wafer is undesirable since it decreases the planarization uniformity of the semiconductor surface.

Another drawback of the above described arrangement is that material removed from the wafer surface forms a "glaze" on the wafer track of the pad. This glaze decreases the effectiveness of the pad in planarizing the surface of the wafer. Mechanisms utilized to condition the pad surface, e.g. remove the glaze, also suffer from several drawbacks. For example, the mechanisms fail to remove the glaze from the entire wafer track upon a single rotation of the pad. As a result, certain portions of the wafer track will have the glaze disposed thereon while other portions will be glaze free while being advanced under the semiconductor wafer. Only having the glaze partially removed from the wafer track can also decrease the planarization uniformity of the semiconductor surface.

Thus, a continuing need exists for an apparatus and method for planarizing the surface of a semiconductor wafer which addresses one or more of the above described problems.

SUMMARY OF THE INVENTION

In accordance with one embodiment of the present invention, there is provided an arrangement for planarizing a surface of a semiconductor wafer. The arrangement includes a planarizing member having a planarizing surface configured to be (i) positioned in contact with and (ii) moved relative to the surface of the semiconductor wafer so as to remove material from the surface of the semiconductor wafer such that surface of the semiconductor wafer is planarized. The arrangement also includes an adherence promoting ligand chemically bonded to the planarizing surface of the planarizing member. The arrangement further includes an abrasion particle chemically bonded to the adherence promoting ligand such that the abrasion particle is attached to the planarizing surface of the planarizing member.

In accordance with another embodiment of the present invention, there is provided a method of planarizing a surface of a semiconductor wafer with a planarizing member having a planarizing surface. The method includes the steps of (i) disposing an adherence promoting ligand onto the planarizing surface so as to form a chemical bond between the adherence promoting ligand and the planarizing surface and (ii) disposing an abrasion particle onto the planarizing surface so as to form a chemical bond between the adherence promoting ligand and the abrasion particle such that abrasion particle is attached to the planarizing surface.

In accordance with yet another embodiment of the present invention, there is provided an apparatus for planarizing a surface of a semiconductor wafer. The apparatus includes a planarizing member having a planarizing surface configured to be (i) positioned in contact with and (ii) moved relative to the surface of the semiconductor wafer so as to remove material from the surface of the semiconductor wafer such that surface of the semiconductor wafer is planarized. The planarizing surface has a wafer track defined thereon. The apparatus also includes a conditioning bar having a conditioning portion positioned in contact with the wafer track. The conditioning portion is configured so that the conditioning portion extends completely across the wafer track.

In accordance with still another embodiment of the present invention there is provided a method of planarizing a surface of a semiconductor wafer with a planarizing member having a planarizing surface with a wafer track defined thereon. The method includes the step of locating a conditioning portion of a conditioning bar in contact with the wafer track. The conditioning portion being configured such that the conditioning portion extends completely across the wafer track. The method also includes the step of positioning the surface of the semiconductor wafer in contact with the wafer track. The method further includes the step of moving the planarizing member relative to the surface of the semiconductor wafer so as to remove material from the surface of the semiconductor wafer.

In accordance with yet another embodiment of the present invention there is provided an apparatus for planarizing a surface of a semiconductor wafer. The apparatus includes a planarizing member having a planarizing surface. The apparatus also includes a wafer carrier configured to receive and hold the semiconductor wafer such that the surface of the semiconductor wafer is in contact with the planarizing surface. The apparatus further includes a slurry mixture disposed on the planarizing surface. The apparatus also includes a carrier activating mechanism operatively coupled to the wafer carrier so that the carrier activating mechanism (i) urges the surface of the semiconductor wafer against the planarizing surface at a first pressure for a first period of time and (ii) urges the surface of the semiconductor wafer against the planarizing surface at a second pressure for a second period of time. The first pressure is greater than the second pressure such that the slurry is advanced from an outer periphery of the semiconductor wafer toward a center portion of the semiconductor wafer.

In accordance with still another embodiment of the present invention there is provided a method of planarizing a surface of a semiconductor wafer. The method includes the step of repeatedly urging the surface of the semiconductor wafer against a planarizing surface of a planarizing member (i) at a first pressure for a first period of time and (ii) at a second pressure for a second period of time. The first pressure is greater than the second pressure, so as to cause a slurry disposed on the planarizing surface to be advanced from an outer periphery of the semiconductor wafer toward a center portion of the semiconductor wafer.

It is an object of the present invention to provide a new and useful apparatus and method for planarizing a surface of a semiconductor wafer.

It is also an object of the present invention to provide an improved apparatus and method for planarizing a surface of a semiconductor wafer.

It is yet another object of the present invention to provide an apparatus and method for planarizing the surface of a semiconductor wafer which increases the planarization uniformity of a surface of a semiconductor wafer.

The above and other objects, features, and advantages of the present invention will become apparent from the following description and the attached drawings.

BRIEF DESCRIPTION OF THE DRAWINGS

FIG. 1 is a top partially fragmentary schematic view of an apparatus for planarizing a surface of a semiconductor wafer which incorporates the features of the present invention therein;

FIG. 2 is a fragmentary side view of the apparatus as viewed in the direction of arrows 2—2 of FIG. 1 showing (i) the wafer carrier urging the semiconductor wafer against the planarizing member and (ii) the wafer carrier schematically coupled to the carrier actuating mechanism;

FIG. 3 is a fragmentary side elevational view of the conditioning bar of the apparatus of FIG. 1 shown in contact with and extending completely across the wafer track of the planarizing member; and FIG. 4 is a schematic representation depicting a number of abrasion particles chemically bonded to the planarizing surface of the planarizing member of the apparatus of FIG. 1 via a number of adherence promoting ligands.

DETAILED DESCRIPTION OF A PREFERRED EMBODIMENT

While the invention is susceptible to various modifications and alternative forms, specific embodiments thereof have been shown by way of example in the drawings and will herein be described in detail. It should be understood, however, that there is no intent to limit the invention to the particular forms disclosed, but on the contrary, the intention is to cover all modifications, equivalents, and alternatives falling within the spirit and scope of the invention as defined by the appended claims.

Referring now to FIGS. 1–3, there is shown an arrangement 10 for planarizing a surface 12 of a semiconductor wafer 14 which incorporates the features of the present invention therein. Arrangement 10 includes a planarizing member 16 which has a planarizing surface 18 (see FIGS. 2 and 4). Planarizing surface 18 is configured to be (i) positioned in contact with and (ii) moved relative to surface 12 of semiconductor wafer 14 so as to remove material from surface 12 of semiconductor wafer 14 such that surface 12 of semiconductor wafer 14 is planarized. Planarizing member 16 is supported on a rotatable table or platen (not shown) which is operatively coupled to a motor (not shown) so that the platen, and thus planarizing member 16, can rotate in the direction indicated by arrow 92 (see FIG. 1).

Arrangement 10 also includes a wafer carrier 24 configured to receive and hold semiconductor wafer 14 in contact with planarizing member 16. As shown in FIG. 2, wafer carrier 24 has an edge portion 70 with a plurality of notches 72 defined therein. Wafer carrier 24 is operatively coupled to a carrier actuating mechanism 26. When utilized, carrier actuating mechanism 26 moves wafer carrier 24, and thus semiconductor wafer 14, back and forth across planarizing surface 18 in the directions indicated by arrow 80 as planarizing member 16 is rotated in the direction indicated by arrow 92. Moving semiconductor wafer 14 back and forth across planarizing surface 18 in the above described manner results in a wafer track 28 having a width $W_1$ being defined on planarizing surface 18 as indicated by dotted lines 102 and 104 (see FIG. 1). In addition, carrier actuating mechanism 26 causes wafer carrier 24, and thus semiconductor wafer 14, to rotate around an axis of rotation 106 (see FIG. 2) while planarizing member 16 is rotated in the direction indicated by arrow 92 and wafer carrier 24 is moved back and forth across planarizing surface 18 in the directions indicated by arrow 80. Furthermore, as discussed in greater detail below, carrier actuating mechanism 26 is configured so as to repeatedly (i) urge surface 12 of semiconductor wafer 14 against planarizing surface 18 at a first pressure for a first period of time and (ii) urge surface 12 of semiconductor wafer 14 against planarizing surface 18 at a second pressure for a second period of time such that the first pressure is greater than the second pressure. In other words, as shown in FIG. 2, carrier actuating mechanism 26 moves semiconductor wafer 14 toward planarizing surface 18 in the direction indicated by arrow 108 for the first period of time and then moves semiconductor wafer 14 away from planarizing surface 18 in the direction indicated by arrow 109 for the second period of time. The moving process is then repeated. However, it should be appreciated that carrier actuating mechanism 26 does not move semiconductor wafer 14 away from planarizing surface 18 to the extent that semiconductor wafer 14 becomes spaced apart from planarizing surface 18.

Arrangement 10 further includes a first spray unit 38, a second spray unit 40, and a third spray unit 46. First spray unit 38 is operatively coupled to a ligand reservoir 42. Ligand reservoir 42 contains a solution of an adherence promoting ligand 20 (see FIG. 4) which will discussed in greater detail below. It should be appreciated that first spray unit 38 is configured and positioned relative to planarizing member 16 so that first spray unit 38 can spray the adherence promoting ligand 20 onto and across the entire width $W_1$ of wafer track 28 as indicated by arrows 74 (see FIG. 1) as planarizing member 16 rotates in the direction indicated by arrow 92.

Second spray unit 40 is operatively coupled to a particle reservoir 44. Particle reservoir 44 contains a suspension of abrasion particles 22 (see FIG. 4) which will discussed in greater detail below. Like first spray unit 38, second spray unit 40 is configured and positioned relative to planarizing member 16 so that second spray unit 40 can spray abrasion particles 22 onto and across the entire width $W_1$ of wafer track 28 as indicated by arrows 76 (see FIG. 1) as planarizing member 16 rotates in the direction indicated by arrow 92.

Third spray unit 46 is operatively coupled to a pH control solution reservoir 48. pH control solution reservoir 48 contains a solution for controlling the pH of the slurry (i.e. the slurry includes the adherence promoting ligands 20, abrasion particles 22, and the pH control solution). Similar to above, third spray unit 46 is also configured and positioned relative to planarizing member 16 so that third spray unit 40 can spray the pH control solution onto and across the entire width $W_1$ of wafer track 28 as indicated by arrows 78 (see FIG. 1).

As shown more clearly in FIG. 3, arrangement 10 also includes a conditioning bar 30 having a conditioning portion 34 defined thereon. Conditioning portion 34 has a first end 56, a second end 58, and a first diameter $D_1$. Conditioning bar 30 includes a first extension rod 60 which extends from first end 56. First extension rod 60 has a second diameter $D_2$. Conditioning bar 30 also includes a second extension rod 62 which extends from second end 58. Second extension rod 62 has a third diameter $D_3$. First diameter $D_1$ is greater than second diameter $D_2$ and third diameter $D_3$.

It should be understood that (i) conditioning portion 34 is interposed between dotted lines 110 and 112 as shown in FIG. 3 and (ii) conditioning portion 34 is configured such that when conditioning portion 34 is positioned in contact with wafer track 28 conditioning portion 34 extends completely across wafer track 28 as shown in FIG. 1. In other words, conditioning portion 34 has a length $L_1$ which is greater than, or substantially equal to, the width $W_1$ wafer track 28. Furthermore it should be understood that conditioning portion 34 has a rough exterior surface. For example, conditioning portion 34 can have a layer 64 of silicon carbide disposed thereon as shown in FIG. 3.

Conditioning bar 30 is operatively coupled to a conditioning bar actuating mechanism 54 as illustrated in FIG. 1. Conditioning bar activating mechanism 54 causes conditioning bar 30 to rotate around a longitudinal axis 50 thereof as indicated by arrow 98 when conditioning portion 34 is in contact with wafer track 28. In addition, conditioning bar activating mechanism 54 causes conditioning bar 30 to (i) advance along longitudinal axis 50 in a first direction for a first time period as indicated by arrow 84 and (ii) advance along longitudinal axis 50 in a second direction for a second time period as indicated by arrow 86. It should be appreciated that the first direction is opposite to the second direction and thus conditioning bar activating mechanism 54 causes conditioning bar 30 to repeatedly move across wafer surface 28 in a "sawing motion" as conditioning bar 30 is rotated around longitudinal axis 50. Moreover, conditioning bar activating mechanism 54 also continuously urges conditioning bar 30 against planarizing surface 18 at a constant pressure during the planarization of semiconductor wafer 14.

Arrangement 10 also includes a conditioning bar 32 positioned adjacent to conditioning bar 30. Conditioning bar 32 is substantially identical to conditioning bar 30. For example, conditioning bar 32 has a conditioning portion 36 which extends completely across wafer track 28 as shown in FIG. 1. Conditioning bar 32 is also operatively coupled to conditioning bar activating mechanism 54 in the same manner as described above in reference to conditioning bar 30. Specifically, conditioning bar activating mechanism 54 causes conditioning bar 32 to rotate around a longitudinal axis 52 thereof as indicated by arrow 100 when conditioning portion 36 is in contact with wafer track 28. In addition, conditioning bar activating mechanism 54 causes conditioning bar 32 to (i) advance along longitudinal axis 52 in a first direction for a first time period as indicated by arrow 88 and (ii) advance along longitudinal axis 52 in a second direction for a second time period as indicated by arrow 90. Thus it should be understood that conditioning bar 32 also moves across wafer track 28 in the above described "sawing motion" when actuated by conditioning bar activating mechanism 54. In addition, like conditioning bar 30, conditioning bar activating mechanism 54 also continuously urges conditioning bar 32 against planarizing surface 18 at a constant pressure during the planarization of semiconductor wafer 14.

As shown in FIG. 1 arrangement 10 is also equipped with a wiper bar 82. Wiper bar 82 is positioned in contact with and spans across wafer track 28.

Arrangement 10 can be used in the following manner to planarize surface 12 of semiconductor wafer 14. Semiconductor wafer 14 is disposed in wafer carrier 24. Wafer carrier 24 is then positioned relative to planarizing member 16 such that surface 12 of semiconductor wafer 14 is in contact with planarizing surface 18. Planarizing member 16 is rotated in the direction indicated by arrow 92. At the same time planarizing member 16 is rotated, carrier actuating mechanism 26 causes (i) wafer carrier 24 to rotate around axis of rotation 106 in the direction indicated by arrow 96 and (ii) wafer carrier 24, and thus semiconductor wafer 14, to move back and forth across planarizing surface 18 in the directions indicated by arrow 80 so as to define wafer track 28.

First spray unit 38 is activated so that adherence promoting ligand 20 is withdrawn from ligand reservoir 42 and sprayed onto wafer track 28. It should be understood that adherence promoting ligand 20 is a chemical that possesses chemical properties such that when adherence promoting ligand 20 is in contact with planarizing surface 18, adherence promoting ligand 20 chemically reacts with planarizing surface 18 such that adherence promoting ligand 20 becomes chemically boned to planarizing surface 18 (see the schematic representation of FIG. 4). It should be appreciated that what is meant herein by adherence promoting ligand 20 being chemically bonded, is that adherence promoting ligand 20 can not be easily removed from planarizing surface 18. For example, adherence promoting ligand 20 becomes chemically bonded to planarizing surface 18 so adherence promoting ligand 20 would not be removed by a simple solvent wash (e.g. water) of planarizing surface 18. Preferably, the chemical bonding that occurs between adherence promoting ligand 20 and planarizing surface 18 is covalent or ionic. However, other types of chemical bonding are contemplated, e.g. hydrogen bonding or van der Waals forces as long as the bonding is strong enough so that adherence promoting ligand 20 can not be easily removed from planarizing surface 18 (e.g. adherence promoting ligand 20 can not be removed by a simple solvent wash of planarizing surface 18).

One group of chemicals which includes compounds which can be utilized in the present invention as the adherence promoting ligands 20 are the organofunctional silanes. Examples of organofunctional silanes include Octyltriethoxysilane, Methyltriethoxysilane, Methyltrimethoxysilane, tris-[3-(Trimethoxysilyl)propyl] isocyanurate, Vinyltriethoxysilane, Vinyltrimethoxysilane, Vinyl-tris-(2-methoxyethoxy) silane, Vinylmethyldimethoxysilane, gamma-Methacryloxypropyltrimethoxysilane, beta-(3,4-Epoxycyclohexyl)ethyltrimethoxysilane, gamma-Glycidoxypropyltrimethoxysilane, gamma-Mercaptopropyltrimethoxysilane, bis-(3-[triethoxisilyl]-propyl)-tetrasulfane, gamma-Aminopropyltriethoxysilane, gamma-Aminopropyltrimethoxysilane, N-beta-(Aminoethyl)-gamma-aminopropyltrimethoxysilane, Tri-aminofunctional silane, bis-(gamma-trimethoxysilylpropyl)amine, N-Phenyl-gamma-aminopropyltrimethoxysilane, Organomodified Polydimethylsiloxane, N-beta-(aminoethyl)-gamma-aminopropylmethyldimethoxysilane, gamma-Ureidopropyltrialkoxysilane, gamma-Ureidopropyltrimethoxysilane, and gamma-Isocyanatopropyltriethoxysilane. The above recited organofunctional silanes are commercially available from the Witco Corporation located in Greenwich, Conn.

Second spray unit 40 is also activated so that abrasion particles 22 (see FIG. 4) are withdrawn from particle reservoir 44 and sprayed onto wafer track 28. Note that abrasion particles 22 can be suspended in an appropriate liquid, e.g. water, to facilitate the spraying. Examples of abrasion particles 22 which can be utilized in the present invention include cerium oxide particles, aluminum oxide particles, zirconium oxide particles, tin oxide particles, aluminum trioxide particles, calcium oxide particles, silicon nitride particles, silicon carbide particles, cesium oxide particles, tungsten oxide particles, titanium nitride particles, titanium oxide particles, and silicon dioxide particles.

It should be appreciated that in addition to the chemical properties of adherence promoting ligand 20 discussed above, adherence promoting ligand 20 also chemically reacts with abrasion particles 22 when in the presence thereof. In particular, in addition to being chemically boned to planarizing surface 18, adherence promoting ligand 20 also becomes chemically boned to abrasion particles. 22 (see the schematic representation of FIG. 4). As discussed above, once adherence promoting ligand 20 becomes chemically boned to abrasion particles 22, abrasion particles 22 can not be easily removed from adherence promoting ligand 20. For example, abrasion particles 22 become chemically bonded to the adherence promoting ligands 20 such that abrasion particles 22 can not be removed from adherence promoting ligands 20 by a simple solvent wash (e.g. an aqueous wash) of the adherence promoting ligand 20-abrasion particle 22 complex.

Therefore, it should be appreciated that chemically binding adherence promoting ligands 20 to planarizing surface 18 of planarizing member 16, and then chemically binding abrasion particles 22 to adherence promoting ligands 20, results in the abrasion particles 22 being attached to planarizing surface 18 of planarizing member 16 as schematically shown in FIG. 4. In particular, abrasion particles 22 are attached or bonded to planarizing surface 18 such that abrasion particles 22 can not be removed from planarizing surface 18 by a simple solvent wash (e.g. an aqueous wash) of planarizing member 16.

Having abrasion particles 22 attached to planarizing surface 18 of planarizing member 16 is an advantage of the present invention since it substantially prevents the above discussed problem of advancing abrasion particles 22 underneath semiconductor wafer 14 (i.e. interposed between semiconductor wafer 14 and planarizing member 16) so as to enhance the planarization thereof. This is true since the abrasion particles 22 are now attached to the planarizing surface 18 and thus are advanced underneath semiconductor wafer 14 as planarizing surface 18 passes underneath semiconductor wafer 14. Thus, the present invention does not rely upon the fluid dynamics of the slurry to advance abrasion particles 22 underneath semiconductor wafer 14. Therefore, no concentration gradient of abrasion particles 22 is formed between a periphery 66 of semiconductor wafer 14 and a center portion 68 thereof (see FIG. 1). Eliminating the abrasion particle concentration gradient enhances the planarization uniformity of semiconductor surface 12. Which becomes even more important as the size (i.e. diameter) of semiconductor wafers being planarized continues to increase.

Furthermore, attaching abrasion particles 22 to planarizing surface 18 in the above described manner allows the use of a much harder stiffer planarizing member 16 as compared to the relatively soft planarizing members which must be utilized when the fluid dynamics of the slurry are relied upon to advance the abrasion particles underneath the semiconductor wafer. Utilizing a harder stiffer planarizing member 16 also enhances the planarization uniformity of surface 12 obtained with arrangement 10 as compared to if other planarization arrangements were used to planarize semiconductor wafer 14. One stiff planarizing member 16 which can be used in the present invention is commercially available from Rodel Industries located in Phoenix, Ariz. as catalogue number IC 1400 (note that the no groove version of IC 1400 is preferred).

In addition, attaching abrasion particles 22 to planarizing surface 18 in the above described manner results in less slurry being utilized in the CMP process. This is true since attaching abrasion particles 22 to planarizing surface 18 reduces the amount of abrasion particles 22 simply washed off of planarizing surface 18. Therefore, a greater proportion of abrasion particles 22 are actually utilized to planarize surface 12 of semiconductor wafer 14 as opposed to being wasted which (i) increases the efficiency of the CMP process and (ii) decreases the amount of waste slurry generated. Reducing the amount of waste slurry generated during the CMP process decreases the cost of planarizing semiconductor wafers.

Now turning to third spray unit 46, third spray unit 46 is also activated so that the pH control solution is withdrawn from pH control solution reservoir 48 and sprayed onto wafer track 28. pH control solution will typically include KOH (Potassium Hydroxide) and have a pH of about 11. pH control solution facilitates the CMP process in a well known manner. Wiper bar 82 is positioned in contact with wafer track 28 to remove excess fluid therefrom.

As previously discussed conditioning bars 30 and 32 are (i) positioned in contact with wafer track 28 and (ii) rotated around their respective longitudinal axes by conditioning bar activating mechanism 54. In addition, each conditioning bar 30 and 32 is moved relative to wafer track 28 in the above described sawing motion by conditioning bar activating mechanism 54. It should be understood that the sawing motion of conditioning bar 30 can be synchronized with the sawing motion of conditioning bar 32 or can be alternating with respect to the sawing motion of conditioning bar 32.

The following discussion regarding the advantages of conditioning bar 30 are also applicable to conditioning bar 32, therefore only the advantages of conditioning bar 30 will specifically discussed herein. However, to properly appreciate the advantages of conditioning bar 30, the process of "conditioning" a planarization member must be understood. Generally, the term "conditioning" as used in reference to a planarization member refers to the steps taken to counter the smoothing or glazing of a planarizing surface and to achieve a relatively high and stable planarizing rate. As such, conditioning is herein defined as a technique used to maintain a planarizing surface in a state which enables proper planarization of a surface of a semiconductor wafer. Conditioning is typically performed by mechanically abrading a planarizing surface in order to renew that surface. Such mechanical abrasion of a planarizing surface may roughen the planarizing surface and remove particles which are embedded in the pores of the planarization member. Opening the pores permits the entrance of slurry into the pores during CMP to enhance planarization. Additionally, the open pores provide more surface area for planarization.

Having conditioning portion 34 configured so that conditioning portion 34 extends completely across wafer track 28 is another advantage of the present invention since it ensures that the entire width $W_1$ of wafer track 28 is conditioned upon each revolution of planarizing member 16 as opposed to only certain portions of a wafer track being conditioned upon a single revolution of a planarization member as with other CMP arrangements. Therefore, the configuration of conditioning portion 34 eliminates the above discussed problem of only having the glaze partially removed from the wafer track during a single rotation of the planarizing member encountered with other CMP arrangements.

Another advantage of conditioning bar 30 stems from the shape thereof. In particular, the fact that conditioning portion 34 of conditioning bar 30 has a greater diameter $D_1$ than either of extension rods 60 or 62 (i.e. $D_2$ and $D_3$, respectively) allows conditioning bar 30 to effectively create a flat bottomed groove 114 (see FIG. 3) in wafer track 28. This is in contrast to other CMP arrangements which use other types of conditioning mechanisms since these arrangements tend to create a groove in the wafer track which has a curved or arcuate shaped bottom with the center of the groove being deeper than the edges. Having a groove in the wafer track with a curved bottom causes problems during the CMP process since the periphery of the semiconductor wafer tends to be urged against the planarizing member with a greater pressure than the center portion. This pressure differential can decrease the planarization uniformity of the semiconductor surface. In contrast, creating flat bottomed groove 114 ensures that surface 12 of semiconductor wafer 14 is urged against planarizing surface 18 at a relatively constant pressure all the way across surface 12 of semiconductor wafer 14 thus enhancing the planarization uniformity of semiconductor wafer 14.

It should be appreciated that while conditioning bar 30 has the above described shape for creating flat bottomed groove 114 in planarizing surface 18, other shapes for conditioning bar 30 are contemplated for creating different shaped grooves in planarizing surface 18 depending upon the fabrication technique being utilized to manufacture semiconductor wafer 14.

During use of arrangement 10 carrier actuating mechanism 26 can be operated to urge semiconductor wafer 14 against planarizing member 16 at a constant pressure or, as previously discussed, operated to repeatedly (i) urge surface 12 of semiconductor wafer 14 against planarizing surface 18 at a first pressure for a first period of time and (ii) urge surface 12 of semiconductor wafer 14 against planarizing surface 18 at a second pressure for a second period of time such that the first pressure is greater than the second pressure as shown in FIG. 2. Urging semiconductor wafer 14 against planarizing surface 18 at two different pressures in the above described manner causes slurry to advance from outer periphery 66 of semiconductor wafer 14 toward center portion 68 of semiconductor wafer 14 in the direction indicated by arrow 94 as shown in FIGS. 1 and 2. This advancement or "pumping" of the slurry from outer periphery 66 to center portion 68 of semiconductor wafer 14 ensures that an appropriate amount of pH control solution, and any other slurry components, are disposed underneath semiconductor wafer 14 so as to promote planarization of surface 12. Moreover, having notches 72 defined in edge portion 70 of wafer carrier 24 -enhances the advancement of the pH control solution, and any other slurry components, toward center portion 68 of semiconductor wafer 14 by decreasing the surface tension of the slurry components.

Furthermore, it should be appreciated that operating carrier actuating mechanism 26 in the above described "pumping" mode can be employed in CMP arrangements which do not utilize the herein described adherence promoting ligands 20 of the present invention so as to facilitate the advancement of slurry (i.e. abrasion particles) underneath the semiconductor wafer.

While the invention has been illustrated and described in detail in the drawings and foregoing description, such illustration and description is to be considered as exemplary and not restrictive in character, it being understood that only preferred embodiments have been shown and described and that all changes and modifications that come within the spirit of the invention are desired to be protected.

What is claimed is:

1. An arrangement for planarizing a surface of a semiconductor wafer, comprising:

a planarizing member having a planarizing surface configured to be (i) positioned in contact with and (ii) moved relative to said surface of said semiconductor wafer so as to remove material from said surface of said semiconductor wafer such that said surface of said semiconductor wafer is planarized;

an adherence promoting ligand chemically bonded to said planarizing surface of said planarizing member; and an abrasion particle chemically bonded to said adherence promoting ligand such that said abrasion particle is attached to said planarizing surface of said planarizing member.

2. The arrangement of claim 1, wherein:

said adherence promoting ligand is covalently bound to said planarizing surface and said abrasion particle.

3. The arrangement of claim 1, wherein:

said adherence promoting ligand includes an organofunctional silane.

4. The arrangement of claim 1, further comprising:

a wafer carrier configured to receive and hold said semiconductor wafer in contact with said planarizing member.

5. The arrangement of claim 4, further comprising:

a carrier actuating mechanism operatively coupled to said wafer carrier so that said carrier actuating mechanism (i) urges said surface of said semiconductor wafer against said planarizing surface at a first pressure for a first period of time and (ii) urges said surface of said semiconductor wafer against said planarizing surface at a second pressure for a second period of time, wherein said first pressure is greater than said second pressure.

6. The arrangement of claim 1, wherein said planarizing surface has a wafer track defined thereon, further comprising:

a conditioning bar having a conditioning portion positioned in contact with said wafer track, said conditioning portion being configured so that said conditioning portion extends completely across said wafer track.

7. The arrangement of claim 1, wherein said planarizing surface has a wafer track defined thereon, further comprising:

a first spray unit for spraying said adherence promoting ligand onto said wafer track so that said adherence promoting ligand will chemically bind to said planarizing surface; and a second spray unit for spraying a plurality of abrasion particles onto said wafer track so that said abrasion particles will chemically bind to said adherence promoting ligand.

8. A method of planarizing a surface of a semiconductor wafer with a planarizing member having a planarizing surface, comprising the steps of:

disposing an adherence promoting ligand onto said planarizing surface so as to form a chemical bond between said adherence promoting ligand and said planarizing surface;

disposing an abrasion particle onto said planarizing surface so as to form a chemical bond between said adherence promoting ligand and said abrasion particle such that said abrasion particle is attached to said planarizing surface; and positioning said planarizing member in contact with said surface of said semiconductor wafer.

9. The method of claim 8, further comprising moving said planarizing surface relative to said surface of said semiconductor wafer so as to remove material from said surface of said semiconductor wafer.

10. The method of claim 9, further comprising the step of:

applying a solution onto said planarizing surface of said planarizing member during said moving step to control the pH of the adherence promoting ligands and the abrasion particle.

11. The method of claim 8 wherein the adherence promoting ligand includes an organofunctional silane.

12. The method of claim 8 wherein positioning said planarizing member further comprises receiving the semiconductor wafer in a wafer carrier and employing the wafer carrier to hold the semiconductor wafer in contact with the planarizing member.

13. A method of planarizing a surface of a semiconductor wafer with a planarizing member having a planarizing surface, comprising the steps of:

disposing an adherence promoting ligand onto said planarizing surface so as to form a chemical bond between said adherence promoting ligand and said planarizing surface;

disposing an abrasion particle onto said planarizing surface so as to form a chemical bond between said adherence promoting ligand and said abrasion particle such that said abrasion particle is attached to said planarizing surface; and applying a solution onto said planarizing surface of said planarizing member during said moving step to control the pH of the adherence promoting ligands and the abrasion particle.

14. The method of claim 8 wherein the adherence promoting ligand includes an organofunctional silane.

15. The method of claim 8 wherein positioning said planarizing member further comprises receiving the semiconductor wafer in a wafer carrier and employing the wafer carrier to hold the semiconductor wafer in contact with the planarizing member.

\* \* \* \* \*